US010595425B2

(12) United States Patent
De Jaegere et al.

(10) Patent No.: US 10,595,425 B2
(45) Date of Patent: Mar. 17, 2020

(54) CORROSION RESISTANT TELECOMMUNICATIONS ENCLOSURE

(71) Applicant: CommScope Connectivity Belgium BVBA, Kessel-Lo (BE)

(72) Inventors: Nicolas De Jaegere, Shilde (BE); Eddy Luc Cams, Bilzen (BE); Christiaan Radelet, Aarschot (BE)

(73) Assignee: CommScope Connectivity Belgium BVBA (BE)

( * ) Notice: Subject to any disclaimer, the term of this patent is extended or adjusted under 35 U.S.C. 154(b) by 191 days.

(21) Appl. No.: 15/570,915

(22) PCT Filed: May 1, 2016

(86) PCT No.: PCT/EP2016/059717
§ 371 (c)(1),
(2) Date: Oct. 31, 2017

(87) PCT Pub. No.: WO2016/177654
PCT Pub. Date: Nov. 10, 2016

(65) Prior Publication Data
US 2019/0029137 A1  Jan. 24, 2019

Related U.S. Application Data

(60) Provisional application No. 62/155,944, filed on May 1, 2015.

(51) Int. Cl.
*H05K 7/00* (2006.01)
*H05K 5/06* (2006.01)
(Continued)

(52) U.S. Cl.
CPC ........... *H05K 5/069* (2013.01); *G02B 6/4248* (2013.01); *G02B 6/4256* (2013.01);
(Continued)

(58) Field of Classification Search
USPC .......................................................... 361/728
See application file for complete search history.

(56) References Cited

U.S. PATENT DOCUMENTS 6,867,371 B2 * 3/2005 Daoud ................. G02B 6/4428
16/2.1
7,169,288 B2  1/2007 Drapeau
(Continued)

OTHER PUBLICATIONS

International Search Report and Written Opinion of the International Searching Authority for corresponding International Patent Application No. PCT/EP2016/059717 dated Nov. 4, 2016, 15 pages.
(Continued)

*Primary Examiner* — Hung S. Bui
(74) *Attorney, Agent, or Firm* — Merchant & Gould P.C.

(57) ABSTRACT

A closure (100/200) protects telecommunications circuitry from water and dust. The closure (100/200) includes a base (128) that has a sidewall (134) that extends upwardly from a bottom (118), and the sidewall (134) has at least one cable port (122/222). The closure (100/200) also includes a cover (126) that attaches to the base (128) to close an interior (130) of the closure (100/200). Further, a galvanic anode (124) is removably secured to the sidewall (134) of the base (128) of the closure (100/200) and electronic circuitry (132) is disposed within the interior (130) of the closure (100/200). The electronic circuitry (132) is active electronic circuitry.

21 Claims, 6 Drawing Sheets

(51) Int. Cl.
*H04Q 1/02* (2006.01)
*G02B 6/42* (2006.01)
*H05K 5/02* (2006.01)
*H05K 5/03* (2006.01)
*H05K 5/04* (2006.01)
*H05K 7/20* (2006.01)

(52) U.S. Cl.
CPC ........... *G02B 6/4268* (2013.01); *H04Q 1/025* (2013.01); *H04Q 1/114* (2013.01); *H05K 5/0247* (2013.01); *H05K 5/03* (2013.01); *H05K 5/04* (2013.01); *H05K 7/20409* (2013.01)

(56) References Cited

U.S. PATENT DOCUMENTS

| | | |
|---|---|---|
| 2004/0211774 A1 | 10/2004 | Daoud et al. |
| 2006/0091001 A1 | 5/2006 | Drapeau |
| 2009/0307984 A1 | 12/2009 | Thompson et al. |
| 2010/0128456 A1 | 5/2010 | Hughes et al. |
| 2012/0313296 A1* | 12/2012 | Drysdale ........... B29C 45/14836 264/447 |
| 2014/0273615 A1* | 9/2014 | Haberek ............ H01R 13/5219 439/519 |
| 2015/0070838 A1 | 3/2015 | Casebolt et al. |

OTHER PUBLICATIONS

Extended European Search Report for corresponding European Patent Application No. 19162058.2 dated Jun. 11, 2019, 5 pages.

* cited by examiner

CORROSION RESISTANT TELECOMMUNICATIONS ENCLOSURE

CROSS-REFERENCE TO RELATED APPLICATION

This application is a National Stage Application of PCT/EP2016/059717, filed on May 1, 2016, which claims the benefit of U.S. Patent Application Ser. No. 62/155,944, filed on May 1, 2015, the disclosures of which are incorporated herein by reference in their entireties. To the extent appropriate, a claim of priority is made to each of the above disclosed applications.

BACKGROUND

Fiber to the distribution point (FTTdp) is a fiber-optic based communication delivery network in which optical fibers are run in an optical distribution network from a central office to locations (i.e., distribution points) located near subscribers. Electrical cables complete the network, extending from the distribution points to the subscribers (e.g., to Optical Network Terminals or other subscriber equipment). The optical signals carried by the optical fibers are converted into electrical signals, which are carried by the electrical cables the remaining distance to the subscribers.

Closures that hold electronic circuitry for transmitting or converting optical signals and electrical signals are sometimes installed underground. Due to this location, the closures can be exposed to moisture and, sometimes, submersion in water.

Other telecommunications closures that are subject to moisture, and sometimes submersion in water, include electrical signals such as for coaxial or other copper telecommunications signal transmission.

Improvements are desired.

SUMMARY

The present disclosure relates to a corrosion resistant closure that holds electronic circuitry to convert or transmit optical signals and for electrical signals.

In accordance with an aspect of the disclosure, a closure for circuitry is disclosed. The closure for circuitry includes a base that has a sidewall extending upwardly from a bottom. The sidewall defines at least one cable port. The closure also includes a cover that attaches to the base to close an interior of the closure. The closure may further include a coating on an outside of the base and the cover. The coating may include a corrosion resistant material, such as an epoxy, in one example. A bumper may be positioned around the sidewall of the base. A galvanic anode may be removably secured to the sidewall. The closure also includes electronic circuitry disposed within the interior of the closure. The electronic circuitry, in one example, is active electronic circuitry.

In accordance with an additional aspect of the disclosure, a closure for circuitry includes a base that has a sidewall that extends upwardly from a bottom, and the sidewall has at least one cable port. The closure also includes a cover that attaches to the base to close an interior of the closure. Further, a galvanic anode is removably secured to the sidewall of the base of the closure and electronic circuitry is disposed within the interior of the closure. The electronic circuitry is active electronic circuitry.

In accordance with an additional aspect of the disclosure, a method for assembling a corrosion resistant closure includes providing a base that has a sidewall that extends upwardly from a bottom. The sidewall defines at least one cable port. The method further includes securing a cover to the base to close an interior of the closure. The method also includes coating the base and the cover with a corrosion resistant material, positioning a bumper around the sidewall of the base, and removably securing a galvanic anode to the sidewall of the base. The method also includes disposing active electronic circuitry within the interior of the closure.

In some examples, the coating may be used alone as a protective device. In further examples, the bumper protects the coating from damage. Preferably, the bumper does not cover areas of the closure needed for heat removal.

In some examples, the galvanic anode may be used alone as a protective device. The galvanic anode may also be used together with the coating. The galvanic anode may be used with the coating and the bumper. The galvanic anode may be secured to any surface of the closure, as desired.

In some examples, the cable port or ports can pass through any portion of the closure.

In some examples, the closure includes a metallic body portion subject to corrosion in the presence of moisture or submerged in water.

A variety of additional aspects will be set forth in the description that follows. The aspects can relate to individual features and to combinations of features. It is to be understood that both the foregoing general description and the following detailed description are exemplary and explanatory only and are not restrictive of the broad inventive concepts upon which the embodiments disclosed herein are based.

BRIEF DESCRIPTION OF THE DRAWINGS

The following drawings are illustrative of particular embodiments of the present disclosure and therefore do not limit the scope of the present disclosure. The drawings are not to scale and are intended for use in conjunction with the explanations in the following detailed description. Embodiments of the present disclosure will hereinafter be described in conjunction with the appended drawings, wherein like numerals denote like elements.

DETAILED DESCRIPTION

Figure 1:
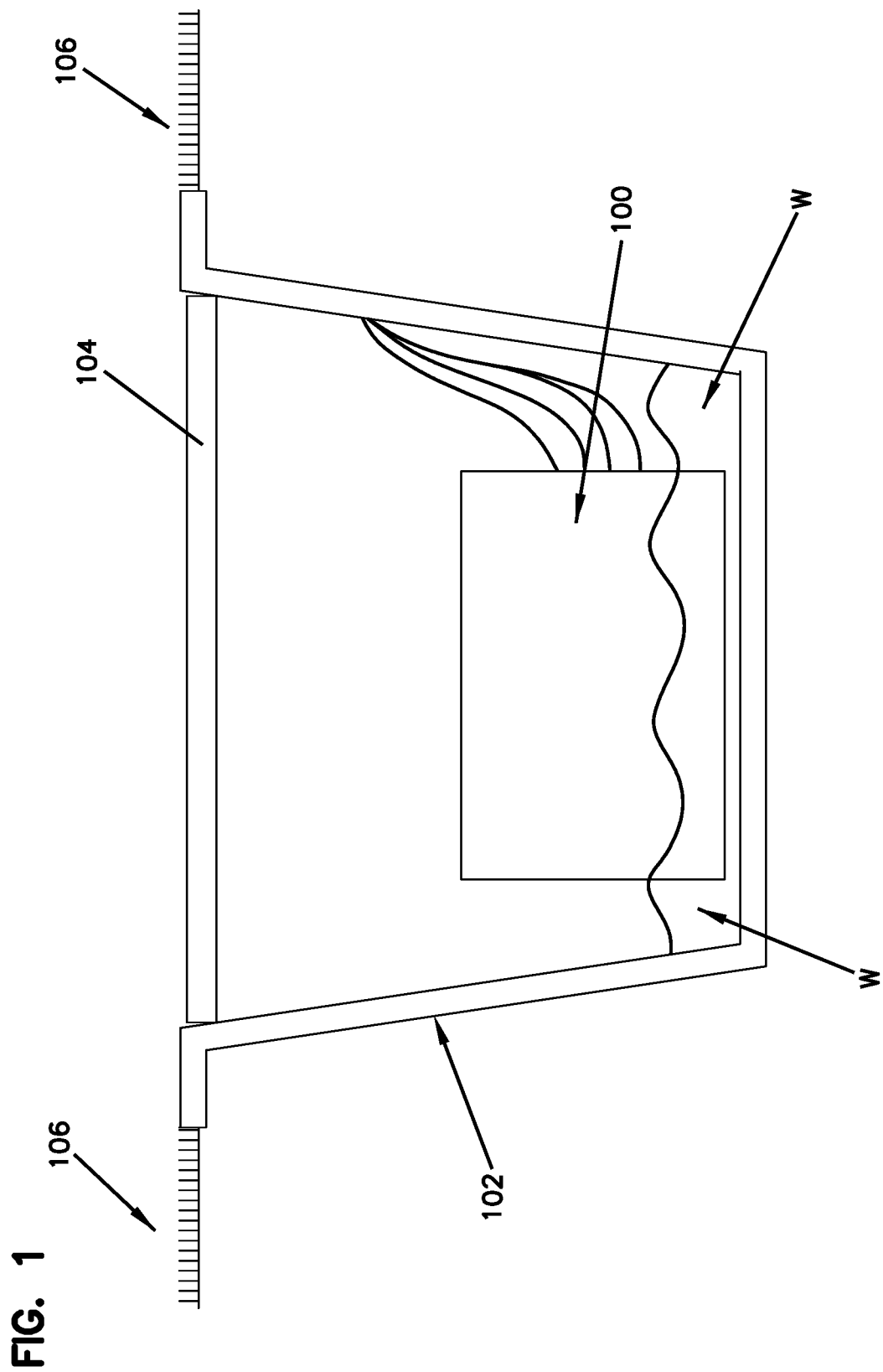
FIG. 1 illustrates a schematic view of a closure in an underground environment, according to one embodiment of the present disclosure.

Various embodiments will be described in detail with reference to the drawings, wherein like reference numerals represent like parts and assemblies throughout the several views. Reference to various embodiments does not limit the scope of the claims attached hereto. Additionally, any examples set forth in this specification are not intended to be limiting and merely set forth some of the many possible embodiments for the appended claims.

The closure disclosed is configured to house active electronic circuitry related to fiber optic signal transmission or conversion. The closure also is configured to environmentally seal (e.g., a water-tight seal, a vapor-tight seal, etc.) the electronic circuitry from an external environment. Additionally, the closure is configured to be corrosion resistant. The closure can also house active electronic circuitry related to copper signal transmission where no fiber optic signals are present.

FIG. 1 illustrates an example environment including an example closure 100. The closure 100 is depicted in an underground container 102. The underground container 102 includes a lid 104 that is generally flush with the ground surface 106. Because the underground container 102 is positioned below the ground surface 106, the container 102 is susceptible to flooding by water, especially rain water. As shown, water W can pool within the underground container 102 and partially or totally submerge equipment within the container 102, including the closure 100. Due to the potential for flooding and moisture levels within the container 102, it is important that the closure 100 be resistant to corrosion.

Figure 2:
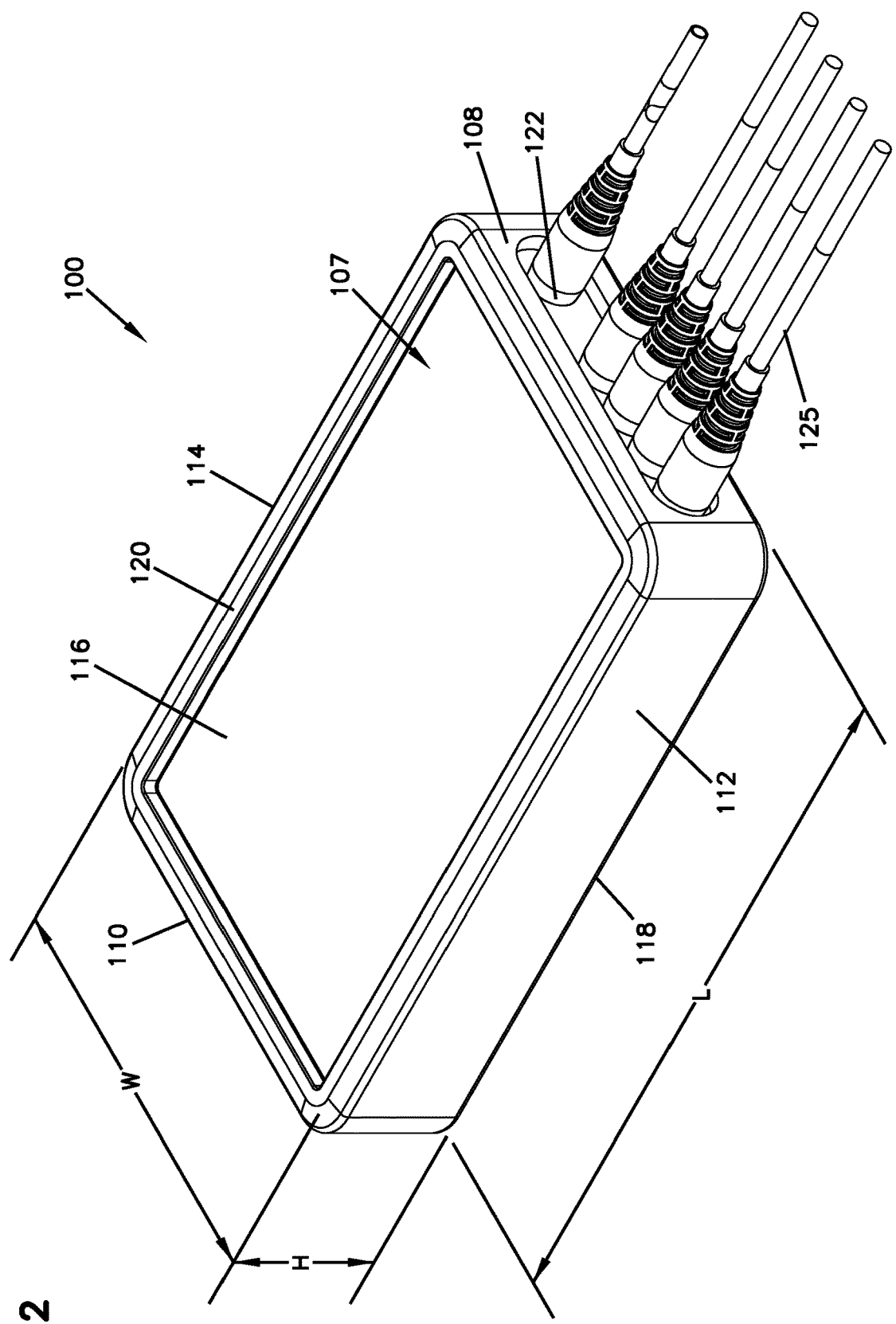
FIG. 2 illustrates a first perspective view of the closure, according to one embodiment of the present disclosure.
Figure 3:
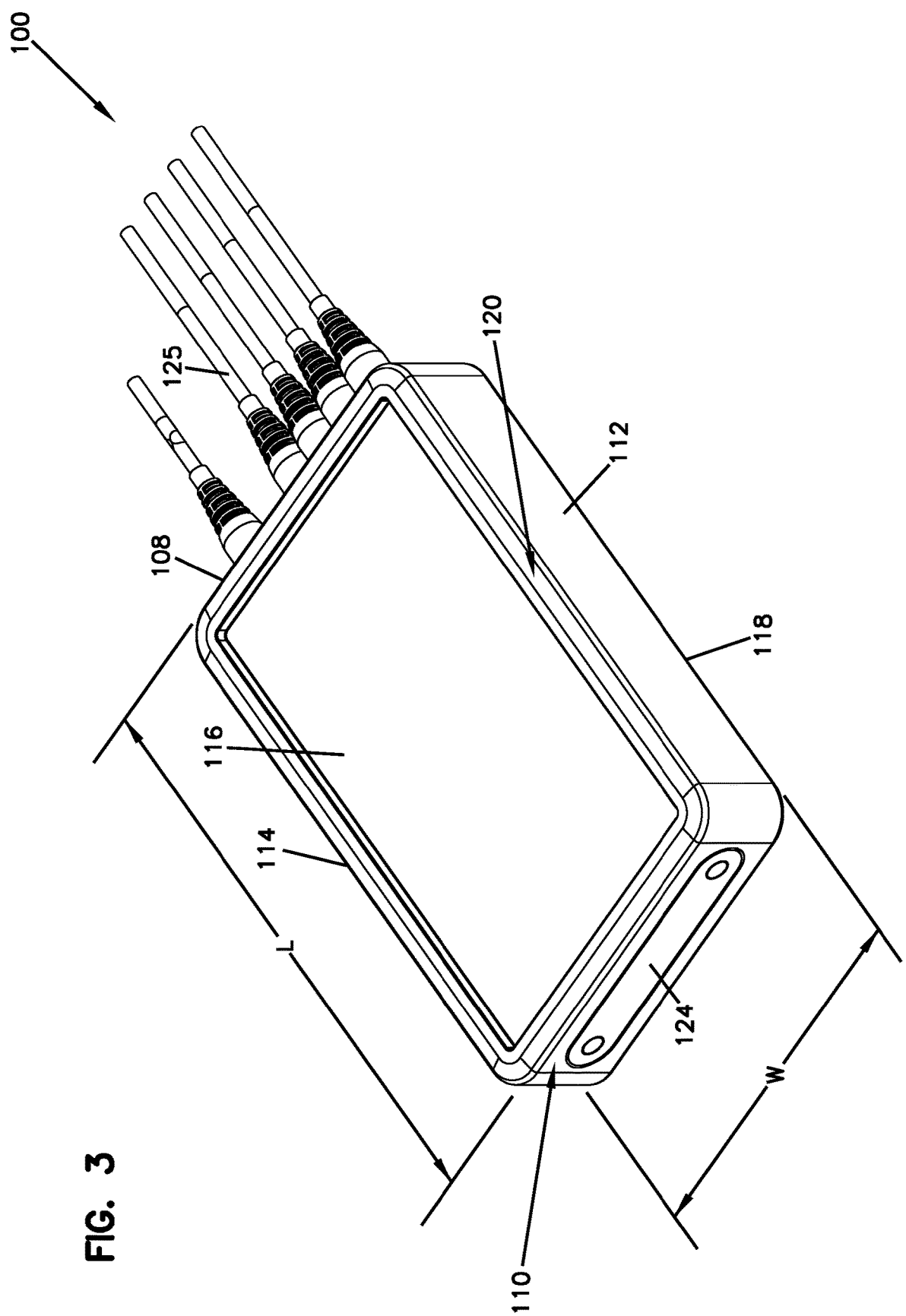
FIG. 3 illustrates a second perspective view of the closure of FIG. 2.

FIGS. 2-3 show perspective views of the closure 100. The closure 100 extends along a length L between a first end 108 and a second end 110, along a width W between a first side 112 and a second side 114, and along a height H between a top 116 and a bottom 118. Additionally, in some embodiments, the closure 100 includes at least one port 122, and a galvanic anode 124. In other embodiments, the closure 100 also includes a bumper 120.

The bumper 120 is configured to be positioned around the closure 100 and to protect the closure 100 from damage (such as dents and scratches). In some embodiments, the bumper can be removable from the closure 100. The bumper covers the sidewalls and edges of the closure 100, which are often more prone to damage, such as damage to the protective coating. The bumper 120 leaves open areas where closure 100 is exposed for heat removal from closure 100. The bumper 120 leaves open areas for the port 122 and the anode 124.

The port 122 is configured to receive a cable 125. In some embodiments, the cable 125 is a fiber optic cable. In other embodiments, the cable 125 is a copper cable. The closure 100 can include a plurality of ports 122 in some embodiments. In the depicted embodiment, the port 122 is configured to be positioned at the first end 108 of the closure 100. However, it is contemplated that the port 122 could be positioned at a side 112, 114 or at the second end 110 of the closure 100 as well. In some embodiments, the port 122 is configured to be positioned at an angle with respect to a side and an end of the closure.

The galvanic anode 124 is configured to offer corrosion protection to the closure 100 by corroding before other portions of the closure 100. The galvanic anode 124 (also known as a sacrificial anode) is electrically connected to the closure 100. Fasteners can be used to attach the anode 124 and allow for later removal and replacement.

Figure 4:
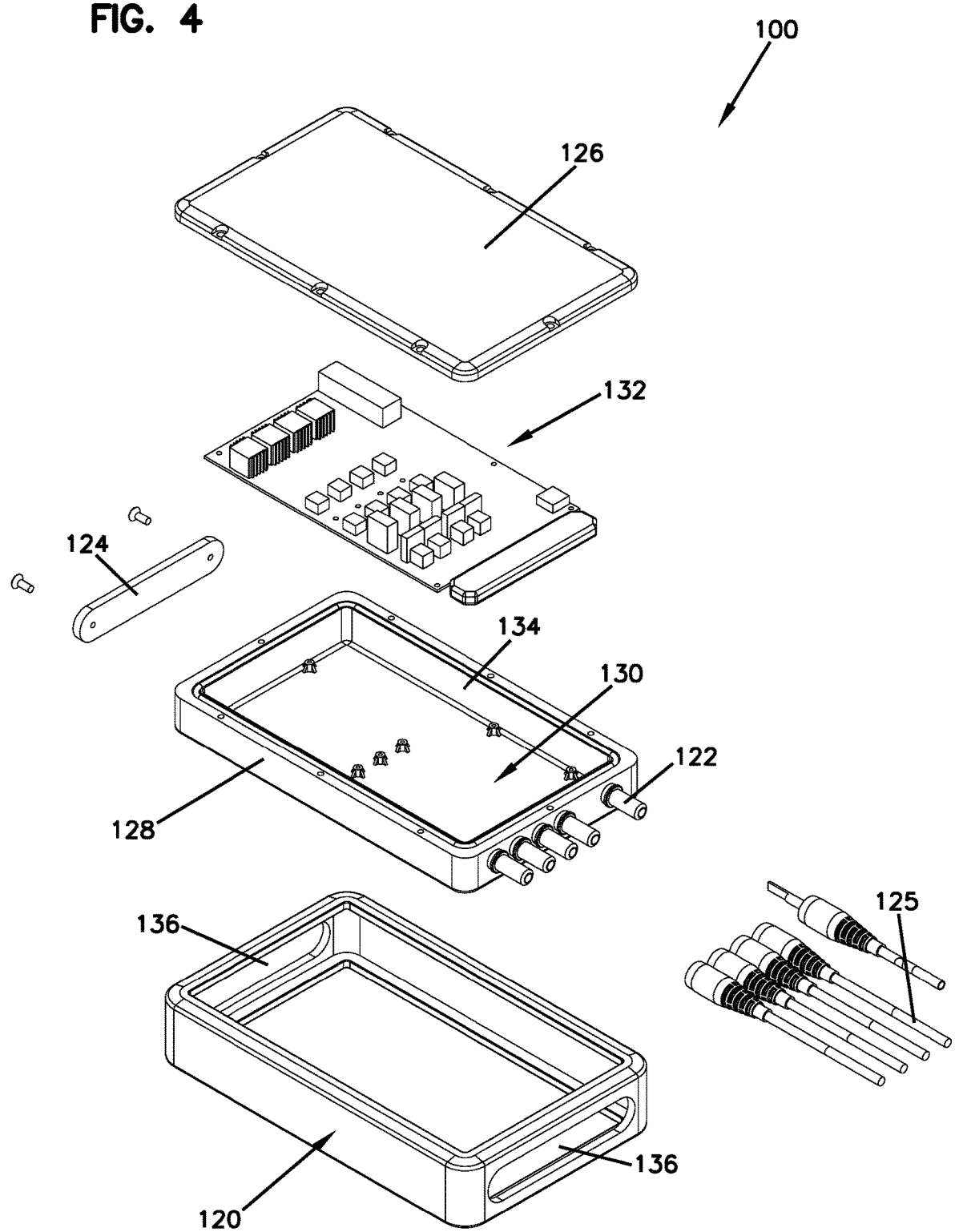
FIG. 4 illustrates an exploded view of the closure of FIG. 2.

FIG. 4 shows an exploded view of the closure 100. The closure 100 includes a cover 126, a base 128, an interior 130, electronic circuitry 132, the bumper 120, the port 122, and the galvanic anode 124. The cover 126 and the base 128 cooperate to define the interior 130. Within the interior 130, the electronic circuitry 132 is disposed. Attached to the base 128 is the bumper 120, at least one port 122, and the galvanic anode 124. The closure 100 is water-tight at the various joints and intersections of parts.

In the example shown, the base 128 includes a sidewall 134 extending upward from the bottom 118. The cover 126 attaches to the sidewall 134 opposite the bottom 118. The base 128 and/or cover 126 can be configured to disperse heat generated by the electronic circuitry 132 within the interior 130 of the closure 100. For example, the base 128 and/or cover 126 can be formed of a thermally conductive material (e.g., a metal). In an example, the base 128 and/or cover 126 can be formed of die cast aluminum. In other examples, the base 128 and/or cover 126 can be formed of thermally conductive plastics.

In some embodiments, the base 128 and/or cover 126 is coated with an epoxy coating or other corrosion protective coating on the exterior surfaces. For example, ammonization of the base 128 and/or cover 126 can be used to create a corrosion resistant coating. The coating can provide a layer of corrosion resistant protection to the closure 100. In addition, the coating improves the durability of the closure 100 by being resistant to scratches and blemishes. These scratches and blemishes could lead to corrosion. More rapid corrosion could occur in a concentrated manner at the damaged areas than if there was no protective coating at all. The bumper 120, if provided, protects the coating in high damage areas, such as the corners and edges of the closure 100. (See FIGS. 5-6 for examples of a closure with a coating)

The electronic circuitry 132 can be disposed within the interior 130. The electronic circuity 132 is active (i.e. powered) and produces heat during normal operation. The electronic circuitry 132 is configured to disperse such operational heat to the base 128 and the cover 126. In some embodiments, the electronic circuity 132 includes a circuit board.

In certain implementations, the electronic circuitry 132 is configured to convert between optical signals and electrical signals. In such implementations, optical signals carried over an optical fiber cable can be converted to electrical signals by the electronic circuitry, and the electrical signals can be carried over the electrical conductor(s). Accordingly, signals carried between a central office and a subscriber can be carried over optical fibers along a majority of the network and carried over electrical conductors only over short distances between the closure 100 and the subscriber.

The bumper 120 provides impact and abrasion protection for closure 100 while still allowing the closure 100 to dissipate heat from the cover 126 and the bottom 118. The bumper 120 includes a pair of openings 136 to allow for the galvanic anode 124 and the at least one port 122 to protrude from the base 128. In some embodiments, in order to improve impact protection, the bumper 120 is rubberized. When installing the bumper to the base 128, the bumper 120 can be stretched around the base until it surrounds the sidewall 134. In other embodiments, the bumper 120 is plastic and can be manufactured to disassemble into sections so that the sections may be secured to, and encase, a portion of the base 128.

The galvanic anode 124 is electrically secured to the base 128, specifically the sidewall 134. In some embodiments, the galvanic anode 124 is removable and replaceable. In some embodiments, the bumper 120 includes an opening which surrounds the galvanic anode 124 when the galvanic anode 124 is installed to the base 128. The galvanic anode 124 is configured to corrode before the base 128 and the cover 126 corrode, thereby maintaining the integrity of the base 128 and cover 126 so that the any electronics located within the interior 130 are not damaged due to a breach to the closure 100 caused by corrosion. The galvanic anode 124 has a more negative reduction potential (also known as more positive electrochemical potential) than that of the base 128 and cover 126 of the closure 100. In some embodiments, the galvanic anode 124 is a less noble metal than both the base 128 and the cover 126. In some embodiments, the galvanic anode 124 is zinc. In other embodiments, the galvanic anode 124 is magnesium.

Figure 5:
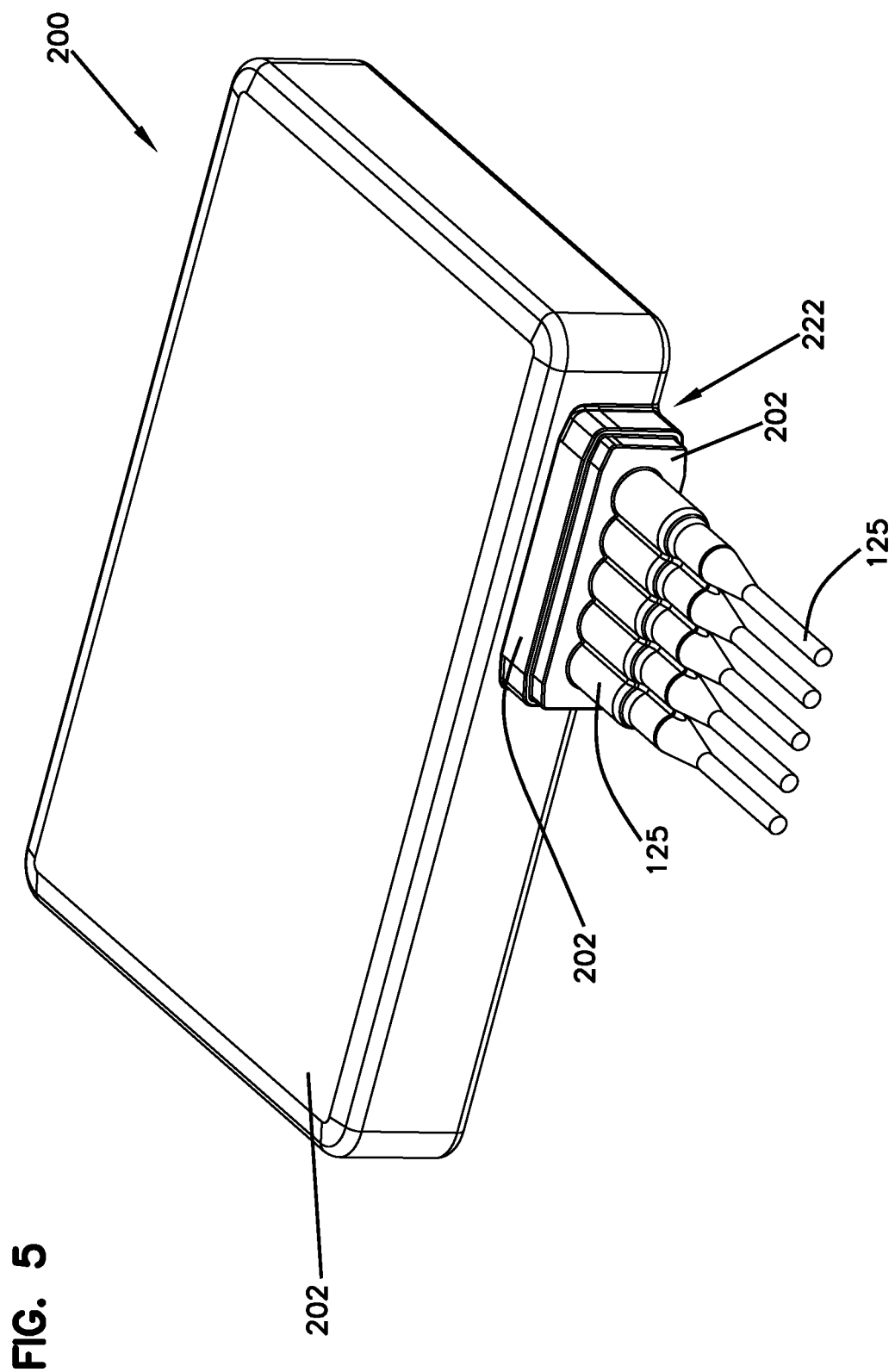
FIG. 5 illustrates a first perspective view of a closure, according to one embodiment of the present disclosure.
Figure 6:
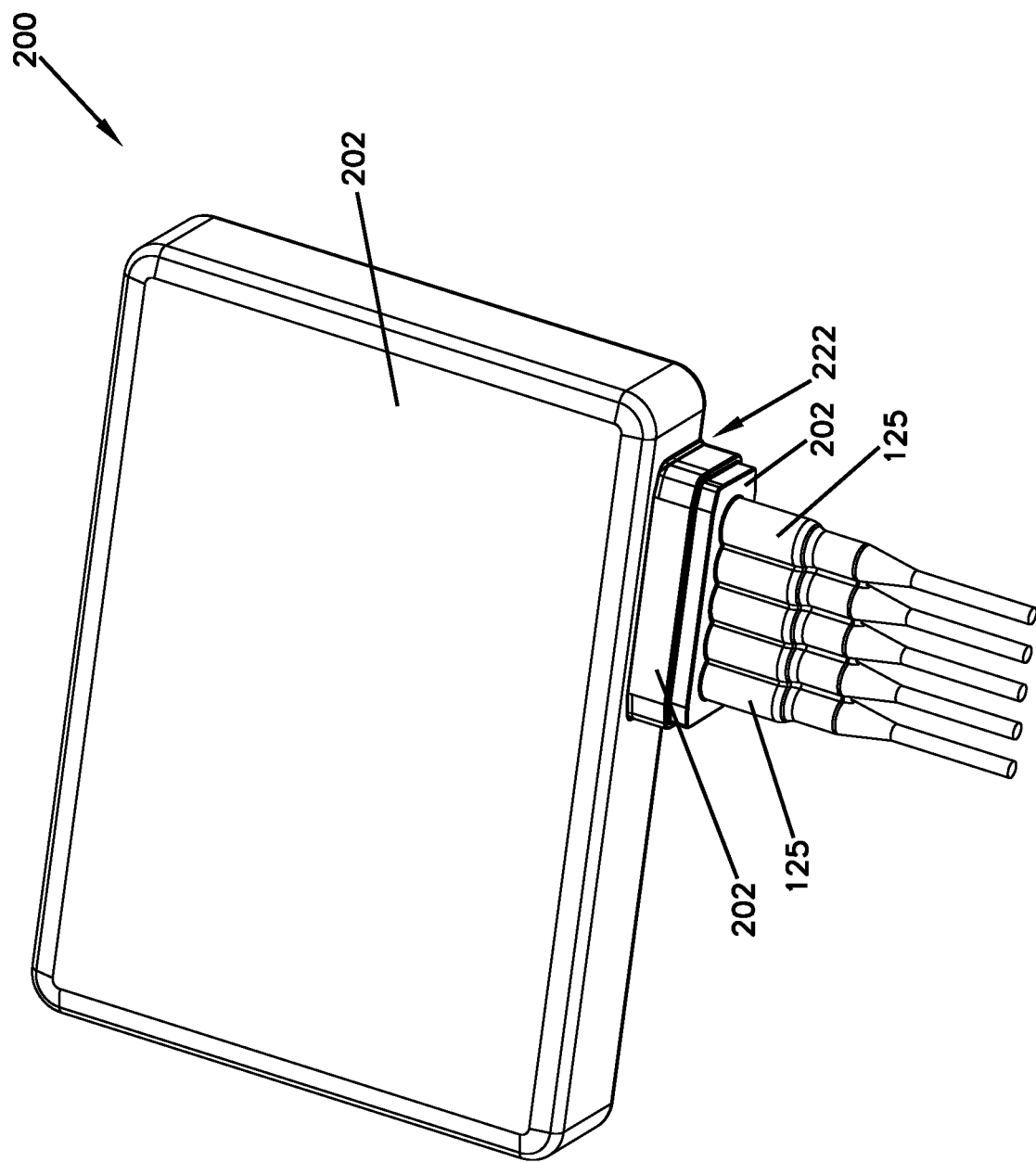
FIG. 6 illustrates a second perspective view of the closure of FIG. 5.

FIGS. 5 and 6 show perspective views a closure 200, according to one embodiment of the present disclosure. The closure 200 is substantially similar to closure 100. In some embodiments, the closure 200 includes at least one port 222 that is configured to receive at least one cable 125. As shown, the closure 200 includes a protective coating 202 at the exterior of the closure 200. In the depicted embodiments, the protective coating 202 covers the port 222 and also at least a portion of the cable or cables 125 when the cable 125 is located in the port 222. The protective coating 202 can be corrosion resistant and impact resistant to improve the durability of the closure 200. In some embodiments, the protective coating can be an overmolding. In still other embodiments, the protective coating 202 can be an overmolded thermoplastic elastomer (TPE).

One aspect of the closure (100) includes:
a body (107) including at least a metallic portion subject to corrosion; wherein in one example the body includes a base and a cover.

Another aspect of the closure (100) includes:
a base (128) having a sidewall (134) extending upwardly from a bottom (118);
a cover (126) that attaches to the base (128) to close an interior (13) of the closure (100).

A further aspect of the closure (100) includes:
at least one cable port (122).

Another aspect of the closure (100) includes one or more of the following:
(a) a coating over the base (128) and the cover (126);
(b) a bumper (120) positioned around a portion of the closure (100), the bumper (120) leaving at least one area of the closure (100) exposed for heat removal; and
(c) a galvanic anode (124) secured to the closure (100).
A further aspect of the closure (100) includes:
electronic circuitry (132) disposed within or disposable within the interior (130) of the closure (100), the electronic circuitry (132) being active electronic circuitry;
wherein the closure (100) is watertight and configured to prevent water from entering the interior (130).

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

PARTS LIST

100 closure
102 underground container
104 lid
106 ground surface
107 body
108 first end
110 second end
112 first side
114 second side
116 top
118 bottom
120 bumper
122 port
124 galvanic anode
125 cable
126 cover
128 base
130 interior
132 electronic circuitry
134 sidewall
136 opening
200 closure
202 protective coating
222 port

What is claimed is:

1. A telecommunications closure comprising:
a housing including an external metallic portion subject to corrosion;
at least one cable port;
a coating over the external metallic portion of the closure subject to corrosion;
a bumper positioned around a portion of the closure, the bumper leaving at least a portion of the closure exposed for heat removal, the bumper also defining a first opening through which the at least one cable port is accessible from an exterior of the housing, the bumper also defining a second opening; and
a galvanic anode secured to the closure and accessible at an exterior of the housing through the second opening defined in the bumper; and
electronic circuitry disposed within or disposable within an interior of the closure, the electronic circuitry being active electronic circuitry;
wherein the closure is watertight and configured to prevent water from entering the interior.

2. The closure of claim 1, wherein the coating includes an overmolding of the closure.

3. The closure of claim 1, further comprising cables extending to and from the closure.

4. The closure of claim 1, further comprising an underground container for receiving the sealed closure.

5. A closure for telecommunications circuitry comprising:
a base having a sidewall extending upwardly from a bottom, the sidewall defining at least one cable port;
a cover that attaches to the base to close an interior of the closure;
a galvanic anode removably secured directly to the sidewall of the base to be moved in unison with the base; and
electronic circuitry disposed within the interior of the closure, the electronic circuitry being active electronic circuitry.

6. The closure of claim 5, further comprising a coating adhered to the base and the cover.

7. The closure of claim 6, wherein the coating includes epoxy.

8. The closure of claim 5, further comprising a bumper positioned around the sidewall of the base.

9. The closure of claim 8, wherein the bumper surrounds the closure and has at least one opening for exposing a surface of the closure for heat removal.

10. A closure for telecommunications circuitry comprising:
a base having a sidewall extending upwardly from a bottom, the sidewall defining at least one cable port;

a cover that attaches to the base to close an interior of the closure;

a coating adhered to the base and the cover, the coating being a corrosion resistant material;

a bumper positioned around the sidewall of the base to surround the closure;

a galvanic anode removably secured to the sidewall of the base; and electronic circuitry disposed within the interior of the closure, the electronic circuitry being active electronic circuitry;

wherein the closure is watertight and configured to prevent water from entering the interior of the base.

11. The closure of claim 10, wherein the base, cover, and galvanic anode are metal, and wherein the galvanic anode is a less noble metal than both the base and the cover.

12. The closure of claim 10, wherein the galvanic anode includes zinc.

13. The closure of claim 10, wherein the galvanic anode includes magnesium.

14. The closure of claim 10, wherein the bumper is removable from the base.

15. The closure of claim 10, wherein the bumper is rubberized.

16. The closure of claim 10, wherein the bumper has at least one opening for exposing a surface of the closure for heat removal.

17. The closure of claim 10, wherein the coating includes epoxy.

18. A method for assembling a corrosion resistant telecommunications closure comprising:

providing a cover and a base having a sidewall extending upwardly from a bottom, the sidewall defining at least one cable port;

providing a coating over the base and the cover including a corrosion resistant material;

providing a galvanic anode to the sidewall of the base;

disposing electronic circuitry within the interior of the closure, the electronic circuitry being active electronic circuitry;

securing the cover to the base to close an interior of the closure;

positioning a bumper around the sidewall of the base, the bumper defining an opening to expose the galvanic anode.

19. The method of claim 18, wherein the base, the cover, and the galvanic anode are metal, and wherein the galvanic anode is a less noble metal than both the base and the cover.

20. The method of claim 19, wherein the galvanic anode includes at least one of zinc and magnesium.

21. The method of claim 19, further comprising stretching the bumper around the sidewall of the base.

* * * * *